United States Patent [19]
Hiraishi

[11] Patent Number: 5,725,660
[45] Date of Patent: Mar. 10, 1998

[54] SEMICONDUCTOR SINGLE CRYSTAL GROWING APPARATUS

[75] Inventor: Yoshinobu Hiraishi, Omura, Japan

[73] Assignee: Komatsu Electronic Metals Co. Ltd., Hiratsuka, Japan

[21] Appl. No.: 758,475

[22] Filed: Nov. 29, 1996

[51] Int. Cl.$^6$ .................................................. C30B 35/00
[52] U.S. Cl. .................... 117/201; 117/14; 117/218
[58] Field of Search .................... 117/14, 15, 20, 117/29, 201, 210, 218

[56] References Cited

U.S. PATENT DOCUMENTS 2,842,467  7/1958  Landauer et al. ............... 117/29

FOREIGN PATENT DOCUMENTS 357106593A  7/1982  Japan ........................... 117/29
404317494A  11/1992  Japan ........................... 117/29

OTHER PUBLICATIONS

"Modulation of Dopant Segregation by Electric Currents in Czochralski-Type Crystal Growth"; Center for Materials Science & Engineering MIT, Lichtensteiger, et al., (Jun. 1971) pp. 1013-1014.

Primary Examiner—Felisa Garrett
Attorney, Agent, or Firm—Varndell Legal Group

[57] ABSTRACT

A semiconductor single crystal growing apparatus is vertically and telescopically provided with a seed holder. The seed holder comprises a seed-holding member for holding a seed and a suspending bolt for bolting the seed-holding member. The front end of the seed coincides with a datum point when the seed holder is moved to a top dead point.

5 Claims, 4 Drawing Sheets

SEMICONDUCTOR SINGLE CRYSTAL GROWING APPARATUS

BACKGROUND OF THE INVENTION

1. Field of the Invention

The present invention relates to a semiconductor single crystal growing apparatus for producing semiconductor single crystals by using the Czochralski Method (the CZ method), especially to an apparatus for detecting a level of a melt surface in a single crystal silicon growing apparatus, which is provided with a purge tube, and thereby automatically prevents the oxygen concentration of the single crystal from changing.

2. Description of Prior Art

The Czochralski Method (hereafter called the CZ method) is a conventional method of producing a single crystal silicon which is the basic material of a semiconductor integrated circuit. In the CZ method, raw materials are melted to be a melt in a crucible, and seeds are lifted up out of the melt to grow a cylindrical single crystal ingot. To accurately control the oxygen concentration of impurities in the grown single crystal, maintaining the level of the melt surface at a predetermined level during the pulling process is very important.

If a growing apparatus is provided with a purge tube, the lower end of the purge tube must be maintained at a constant distance from the melt surface, otherwise the oxygen concentration in the crystal will be unstable. The position of the lower end of the purge is determined according to the structure of the growing apparatus. The melt level is significantly influenced by the deviation of the quantity of polycrystal raw materials, the deviation in thickness of the quartz crucible and the change of the shape of a graphite crucible (the graphite crucible is used to hold the quartz crucible). In other words, the distance between the melt surface and the lower end of the purge tube may change. As a result, the oxygen concentration of the grown single crystal also changes.

Therefore, a very important object is to accurately detect where the level of the melt surface is so as to maintain the oxygen concentration at a target value.

Many methods have been developed to detect the level of the melt surface.

FIGS. 3 and 4 are used to depict the prior art, whereby the object of this invention can be easily understood.

Japanese Patent Application No.6-293590 discloses a detecting method, as shown in FIG. 3, wherein a reflective mirror (22) is mounted at the lower end of a purge tube (21). A laser beam (L1) is projected onto the lower end of the purge tube (21). Then, the position of the lower end of the purge tube (21) can be found by detecting the change of the laser path. Also, another laser beam (L2) parallel to the laser beam (L1) is projected onto a melt surface (23) to find the position of the melt. Then, the distance between the melt surface (23) and the lower end of the purge tube (21) can be determined according to the difference between the above two detecting values.

In the above-mentioned method, the reflective mirror (22) is mounted at the lower end of the purge tube (21) as a datum point, where is near the silicon melt. The surrounding temperature is about 1300 °–1400° C., close to the melting point of polycrystal silicon.

The reflective mirror (22) is exposed to $SiO_2$ vapor, which is generated from the silicon melt surface. To ensure that the mirror can function well under such a high temperature, choosing the material and finishing method of the reflective mirror (22) is very important. However, it is very difficult to make a correct choice in practice.

Generally the purge tube (21) is shaped as an inverted cone and its lower end is arranged close to the outer circumference of the single crystal ingot (24). The detected point on the melt surface is also close to the outer circumference of the single crystal ingot (24). A meniscus swell resulting from a surface tension is formed at the interface between the crystal (24) and the melt surface (23). The swell can disturb the reflective angle of the laser beam. As a result, it is difficult to correctly detect the melt surface. Furthermore, a window is necessarily provided on a chamber for allowing the laser beam to pass therethrough. On the other hand, however, a furnace in the chamber needs to be isolated from the outside air. Furthermore, such a laser detector is very expensive.

Japanese Patent Application No. 5-59876 discloses another method, as shown in FIG. 4, wherein an optical detector (26) for detecting the position of the lower end of a seed (25) is provided in a chamber. It is an effective method to find the position of the melt surface, although the distance between the purge tube and the melt surface is not necessarily measured.

If the optical detector (26) is mounted at a single crystal growing apparatus of the prior art, then a new window has to be provided on the chamber and a considerable modification to the chamber is therefore necessary. However, it is not economic. Furthermore, the seed needs to be repeatedly used. This causes the seed to have an irregular shape (except for the first use), and the front end of the seed generally becomes sharp.

Under this situation, the optical detector activated by the reduction of the light quantity may possibly generate an error while detecting the sharp front end of the seed. That is, the optical detector fails to accurately detect where the front end of the seed is.

SUMMARY OF THE INVENTION

An object of the present invention is to provide a semiconductor single crystal growing apparatus which can accurately measure the level of a melt surface at low cost.

In accordance with the object of the present invention, there is provided a semiconductor single crystal growing apparatus for growing a semiconductor single crystal by using the Czochralski method. The semiconductor single crystal growing apparatus comprises a detecting means for detecting the electrical contact between a seed and a melt in a crucible; a seed-holding means mounted above the melt for holding the seed; a suspending means which suspends the seed-holding means and is capable of lifting, lowering and rotating the seed-holding means; a pulse generating means for generating pulses proportional to the distance in which the seed is lowered; and a counting means for counting pulse numbers, when the seed is lowered from a datum position to an electrical contact position, and generating signals indicating levels of melt surfaces. The semiconductor single crystal growing apparatus is characterized in that the seed-holding means is vertically and telescopically mounted.

In this invention, the detector mounted at the datum point under the seed and the window provided on the chamber are not required. However, this invention provides the same function as Japanese Patent Application No. 5-59876.

The front end of the seed is necessarily maintained at the datum point, although the length of the seed may vary. Therefore, the above-mentioned detector is required in the prior art. In this invention, the position of the front end of the seed (FIG. 1) can remain unchanged by extending or contracting the seed holder (A). Therefore, the detector is not required in this invention.

Actually, the length of the seed holder (A) can be regulated by using a simple jig (a ruler (8)) before the seed holder (A) is mounted on the cable or lifting shaft of the single crystal growing apparatus. A limit switch (19) can be mounted at the top dead point of the single crystal growing apparatus to determine the distance that the seed holder moves from the top dead point to the point at which the seed contact to the melt surface. Therefore, the single crystal growing apparatus is not necessarily modified. The front end of the seed can be accurately maintained at the datum point.

Japanese Patent Application No. 6-48888, submitted by the inventor of this application, can provide another solution, in which the isolation between the seed and the lifting machine is not required.

The above description concerns measuring the level of a melt surface. The distance between the lower end of the purge tube and the melt surface is found. Then, the found value is compared with a target value to correct the vertical movement of the crucible and to grow a crystal. Accordingly, any deviation of the oxygen concentration can be prevented.

Control of other conditions significantly influencing the oxygen concentration is also available. For example, the pressure in the furnace, the argon quantity flowing into the furnace and the number of crucible revolutions. By controlling the above conditions, any deviation of the oxygen concentration resulting from the error of the distance between the lower end of the purge tube and the melt surface can be compensated for.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

Figure 1:
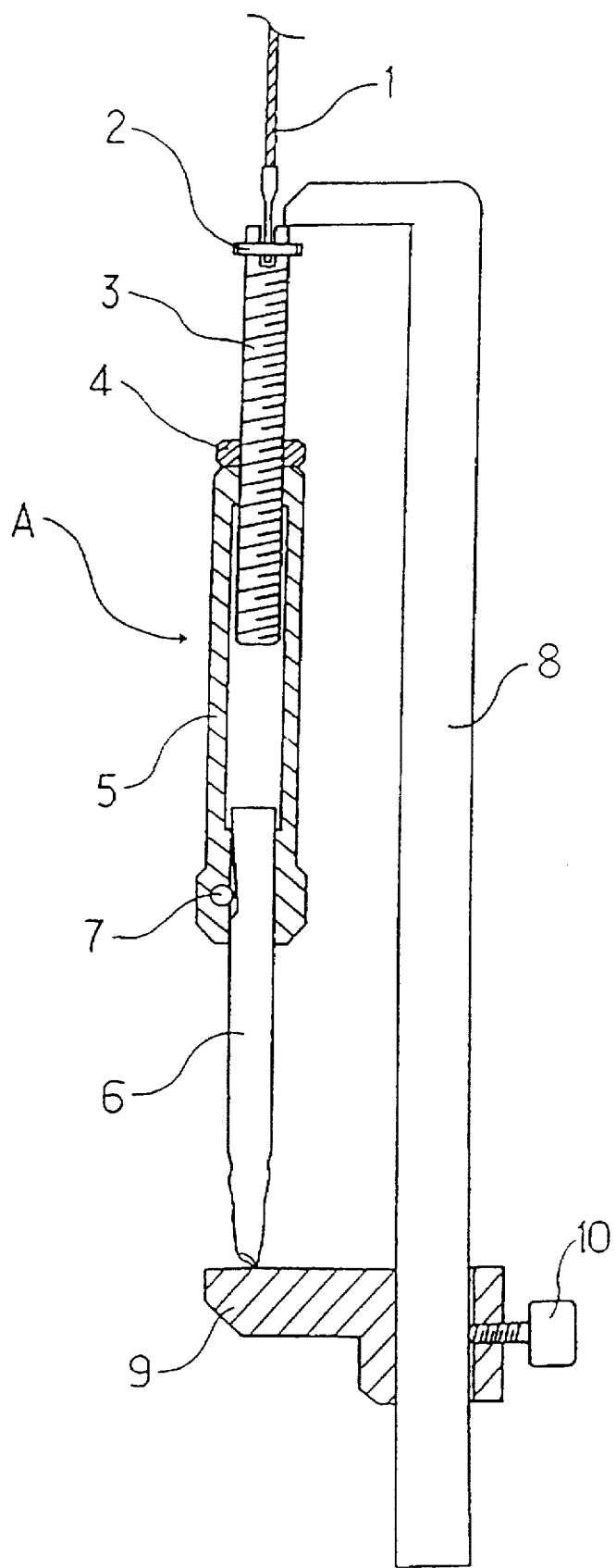
FIG. 1 is a sectional diagram of a seed holder according to this invention.

As shown in FIG. 1, a seed holder (A) is suspended by a stainless steel cable (1) through a connecting pin (2). The seed holder (A) has a seed-holding member (5) for holding a seed. Reference number (3) is a suspending bolt, mounted in the seed-holding member (5) to regulate the length of the seed holder (A). This arrangement can make the seed holder (A) extensible. After being regulated, the seed holder (A) is fixed by a nut (4).

Reference number (7) is a molybdenum pin for fixing the seed (6). Reference number (8) is a rule for setting the length of the seed holder (A). A cursor (9) provided on the rule (8) is fixed at a desired position by a fixing screw (10).

Figure 2:
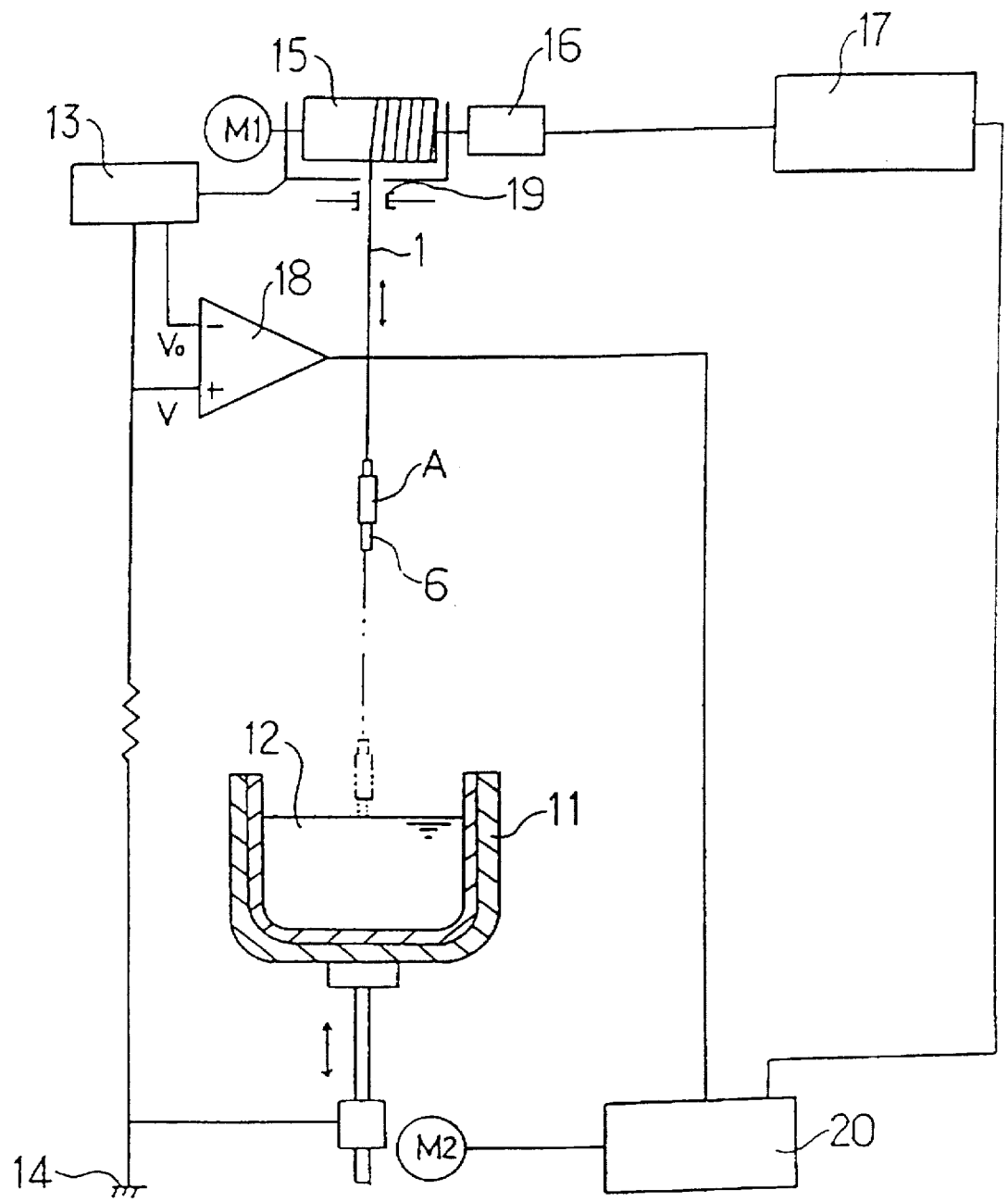
FIG. 2 is a schematic diagram of a device for producing a single crystal silicon according to this invention.
Figure 3:
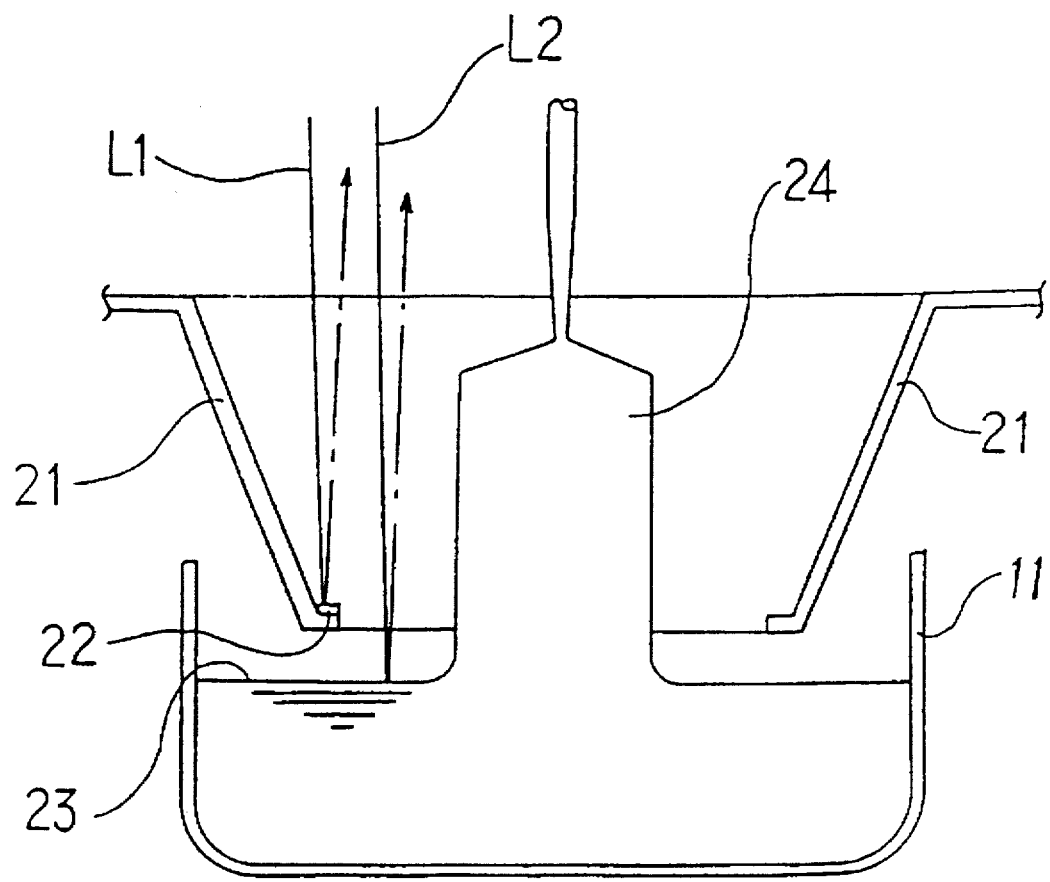
FIG. 3 is a schematic diagram for illustrating the prior art.
Figure 4:
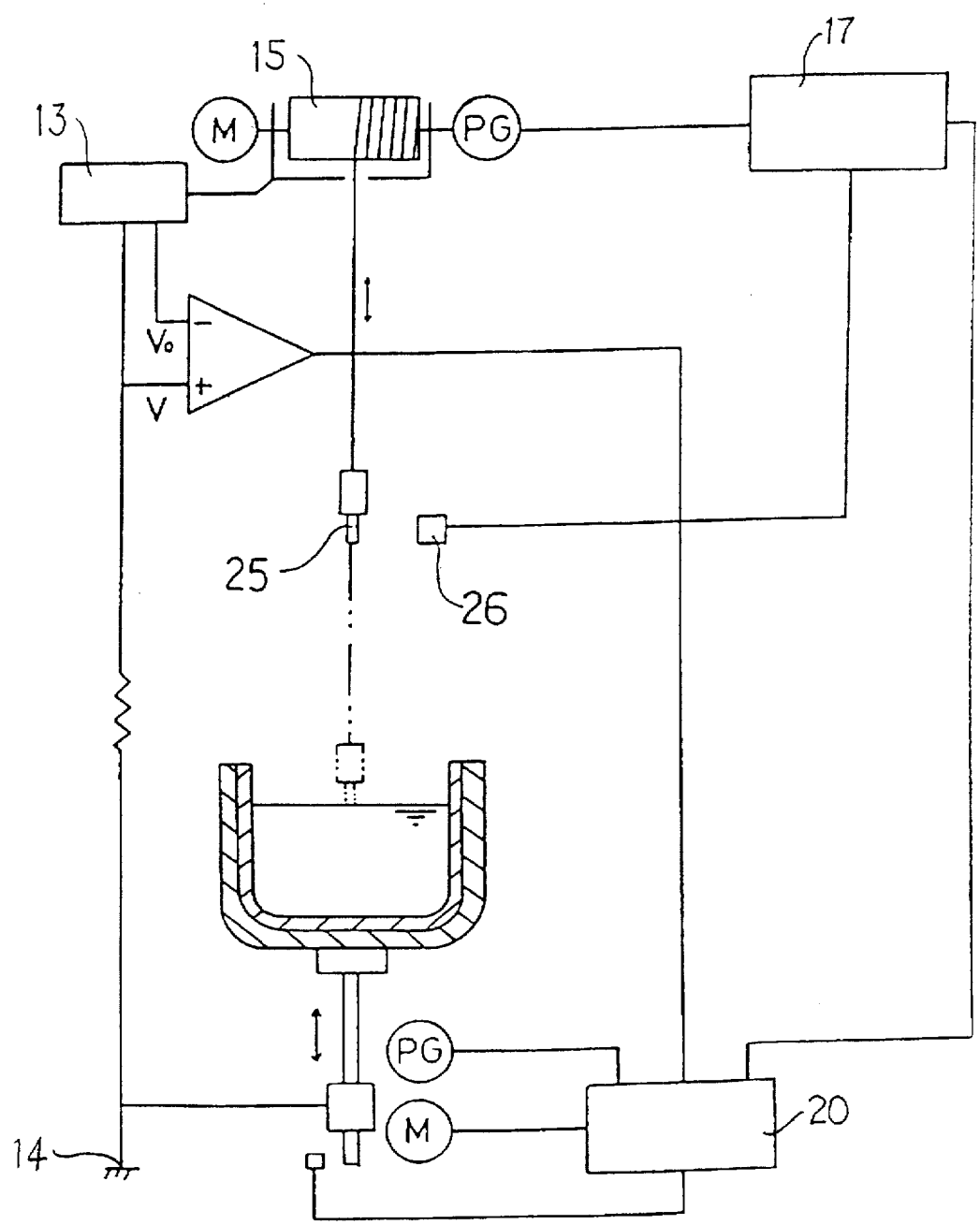
FIG. 4 is the other schematic diagram for illustrating the prior art.

The seed holder (A) is regulated so that the distance between the front end of the seed (6) and the upper end of the seed holder (A) is 300 mm. Then, the seed holder (A) is mounted on the single crystal growing apparatus, as shown in FIG. 2, to grow a single crystal.

Whether the seed (6) touches the melt (12) is detected by a voltmeter (18). The cable (1) is connected to a constant-current source (13) which can supply a maximum voltage of 24 V and a constant current of 0.2 mA. As a result, the voltage difference between the cable (1) and the ground (14) is 23.7 V under a non-contact situation, and the voltage difference is 1 V under contact. Such a voltage variation is great enough to allow the operator to readily and correctly make a judgment. The quantity of the silicon is 60 kg.

The cable (1) is wrapped around a drum (15) and connected to an optical rotating encoder (16). A counter (17) counts the pulses generated from the encoder (16). By this arrangement, the distance that the seed holder moves from the top dead point to the melt surface can be found. In this embodiment, the distance from the top dead point to the melt surface is set as 2700 mm, which can be repeatedly measured and determined. The measuring error is only ±0.5 mm.

Symbols (M1) and (M2) are driving motors. Reference number (11) is a crucible. (20) is a controller for controlling the revolution number and the upward and downward movement of the crucible (11) according to the measuring value of the counter (17) and voltage meter.

Actually the melt surface for each batch of the grown single crystals varies 2–3 mm. Under the conventional growing condition, the oxygen concentration varies $0.12 \times 10^{17}$ atoms/cm$^3$ while the melt surface rises 1 mm. Accordingly, the oxygen concentration deviates $0.36 \times 10^{17}$ atoms/cm$^3$ from the optimum value of the oxygen concentration.

In this embodiment, the measuring error of the distance between the melt surface and the purge tube can be reduced to within the range of ±0.5 mm even if the setting value of the distance exceeds 20 mm. The deviation of the oxygen concentration can be diminished from $0.47 \times 10^{17}$ atoms/cm$^3$ (the prior art) to $0.3 \times 10^{17}$ atoms/cm$^3$ (this invention).

This invention provides the following advantages:

(1) It is not necessary to provide a detector at the datum plane under the seed. In other words, it is not necessary to modify the single crystal growing apparatus. Therefore, the level of a melt surface can be accurately measured because no measuring error results from the detector.

(2) The oxygen concentration, the indicator of the quality of a single crystal silicon, can be controlled much better than before. The deviation of the oxygen concentration can be reduced, increasing the production yield of single crystal silicon and ensuring uniform quality of the single crystal silicon.

What is claimed is:

1. A semiconductor single crystal growing apparatus for growing a semiconductor single crystal by using the Czochralski method, comprising:

a detecting means for detecting an electrical contact position at which a seed electrically contacts a melt in a crucible;

a seed-holding means mounted vertically and telescopically for holding the seed;

a suspending means for suspending the seed-holding means and for lifting, lowering and rotating the seed-holding means;

a pulse generating means for generating pulses proportional to a distance in which the seed is lowered;

a counting means for counting a number of pulses during a time period when the seed is lowered from a datum position to the electrical contact position, and generating signals for detecting a level of the melt surface based on the number of pulses; and control means for determining a distance between the level of the melt surface and the front end of the seed based on the signals.

2. The semiconductor single crystal lift apparatus as set forth in claim 1, wherein the seed-holding means comprises:

a seed-holding member for holding the seed;

a suspending bolt for bolting the seed-holding member; and a cable for holding the seed-holding member and for vertically moving the seed-holding member.

3. The semiconductor single crystal growing apparatus as set forth in claim 1, wherein said control means corrects a vertical movement of the crucible corresponding to the signals, so that a distance between the level of the melt surface and the lower end of the purge tube is a target value.

4. A method of growing a semiconductor single crystal by using the growing apparatus as claimed in claim 1, comprising the steps of:

mounting the seed-holding means and holding the seed above the melt;

measuring the distance between the level of the melt surface and the front end of the seed; and controlling a vertical movement of the crucible based on the signals, so that a distance between the level of the melt surface and the lower end of the purge tube is a target value.

5. The method of growing a semiconductor single crystal by using the growing apparatus as claimed in claim 4, wherein the measuring step includes:

holding the seed above the melt by suspending the seed-holding means vertically and telescopically;

lowering the seed-holding means from a datum position to the electrical contact position by the seed-holding means;

generating pulses proportional to a distance in which the seed is lowered;

detecting the electrical contact position at which the seed electrically contacts the melt in the crucible;

counting the number of pulses during the time period when the seed is lowered from the datum position to the electrical contact position, and generating the signals for detecting a level of the melt surface based on the number of pulses; and detecting the distance between the level of the melt surface and the front end of the seed based on the signals.

* * * * *